(12) United States Patent
Morimoto

(10) Patent No.: US 12,250,482 B2
(45) Date of Patent: Mar. 11, 2025

(54) PHOTOELECTRIC CONVERSION APPARATUS, IMAGING SYSTEM, MOVABLE OBJECT, AND SEMICONDUCTOR SUBSTRATE

(71) Applicant: CANON KABUSHIKI KAISHA, Tokyo (JP)

(72) Inventor: Kazuhiro Morimoto, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 18/427,462

(22) Filed: Jan. 30, 2024

(65) Prior Publication Data

US 2024/0171876 A1 May 23, 2024

Related U.S. Application Data

(63) Continuation of application No. 16/751,099, filed on Jan. 23, 2020, now Pat. No. 11,937,004.

(30) Foreign Application Priority Data

Jan. 30, 2019 (JP) .................................. 2019-014728

(51) Int. Cl.
| | |
|---|---|
| H01L 27/146 | (2006.01) |
| H01L 31/02 | (2006.01) |
| H01L 31/107 | (2006.01) |
| H04N 25/75 | (2023.01) |

(52) U.S. Cl.
CPC ....... *H04N 25/75* (2023.01); *H01L 27/14634* (2013.01); *H01L 31/02019* (2013.01); *H01L 31/107* (2013.01)

(58) Field of Classification Search
CPC ............ H01L 31/035272; H01L 25/18; H01L 27/1463; H01L 27/14643; H01L 31/1037; H01L 27/1446; H01L 31/02019; H01L 31/111; H01L 31/103; G01J 1/42
See application file for complete search history.

(56) References Cited

U.S. PATENT DOCUMENTS

2018/0270405 A1* 9/2018 Ota ........................ H01L 31/107

FOREIGN PATENT DOCUMENTS

JP 2020085815 A 6/2020

* cited by examiner

*Primary Examiner* — Tony Ko
(74) *Attorney, Agent, or Firm* — Canon U.S.A., Inc. IP Division

(57) ABSTRACT

A photoelectric conversion apparatus includes a photodiode, a generation circuit, a first control circuit, and a second control circuit. The photodiode is configured to perform avalanche multiplication. The generation circuit is configured to generate a control signal. The first control circuit is configured to be controlled by the control signal to be in a standby state where the avalanche multiplication by the photodiode is possible and in a recharging state for returning the photodiode having performed the avalanche multiplication to the standby state. The second control circuit is configured to count a number of periods in which the avalanche multiplication has occurred among a plurality of periods of the standby state by using the control signal and a signal corresponding to an output of the photodiode.

16 Claims, 13 Drawing Sheets

PHOTOELECTRIC CONVERSION APPARATUS, IMAGING SYSTEM, MOVABLE OBJECT, AND SEMICONDUCTOR SUBSTRATE

CROSS REFERENCE OF RELATED APPLICATIONS

This application is a continuation of U.S. patent application Ser. No. 16/751,099, filed Jan. 23, 2020 which claims the benefit of Japanese Patent Application No. 2019-014728, filed Jan. 30, 2019, all of which are hereby incorporated by reference herein in its entirety.

BACKGROUND

Field

The present disclosure relates to a photoelectric conversion apparatus, an imaging system, and a movable object.

Description of the Related Art

There is known a photon-counting photoelectric conversion apparatus that digitally counts the number of photons incident on a light receiving unit that performs avalanche multiplication, and the photoelectric conversion apparatus outputs a counting value of the counting as a digital signal from a pixel. Japanese Patent Application Laid-Open No. H7-67043 discusses an apparatus that detects whether a photon is incident on a photodiode by detecting a pulse output by an amplifier, which receives a signal input from the photodiode, in a period between periodical reset pulses. In the apparatus, a counting value corresponding to the number of photons incident on a pixel is obtained by counting up the number of times a result indicating incidence of a photon has been obtained.

More specifically, in the apparatus discussed in Japanese Patent Application Laid-Open No. H7-67043, if the reset pulse is input to a reset transistor, an electric potential of the photodiode is recharged so that the photodiode enters a standby state for the next avalanche multiplication. An electric potential of an input portion of a counting value holding unit is reset by the input of the reset pulse. If a photon is incident on the photodiode again, the electric potential of the input portion of the counting value holding unit changes due to the avalanche multiplication. In response to the change in the electric potential, the counting value holding unit adds 1 to the counting value held therein. In this way, among a plurality of periods of the standby state for the avalanche multiplication, the period in which the avalanche multiplication has occurred is counted.

SUMMARY

According to an aspect of the disclosure, a photoelectric conversion apparatus includes a photodiode, a generation circuit, a first control circuit, and a second control circuit. The photodiode is configured to perform avalanche multiplication. The generation circuit is configured to generate a control signal. The first control circuit is configured to be controlled by the control signal to be in a standby state where the avalanche multiplication by the photodiode is possible and in a recharging state for returning the photodiode having performed the avalanche multiplication to the standby state. The second control circuit is configured to count a number of periods in which the avalanche multiplication has occurred among a plurality of periods of the standby state by using the control signal and a signal corresponding to an output of the photodiode.

Further features of the disclosure will become apparent from the following description of exemplary embodiments with reference to the attached drawings.

DESCRIPTION OF THE EMBODIMENTS

There is a case where a photon is incident on a photodiode, such as a case where high-luminance light is incident on the photodiode, at a timing of recharging the photodiode or at a timing shortly afterward thereof. In such a case, an electric potential of an input portion of a counting value holding unit retains a photon-detected state, i.e., remains unchanged. As a result, such a period is not counted as a period in which a photon is obtained. Accordingly, an actual counting value becomes smaller than a counting value corresponding to luminance of the incident light. Thus, the luminance of an image becomes lower than the original luminance.

The present disclosure is directed to a photoelectric conversion apparatus that appropriately detects the number of periods in which avalanche multiplication has occurred among a plurality of periods of a standby state for the avalanche multiplication.

A photoelectric conversion apparatus and a driving method therefor according to a first exemplary embodiment of the present disclosure will be described with reference to FIGS. 1 to 3.

Figure 1:
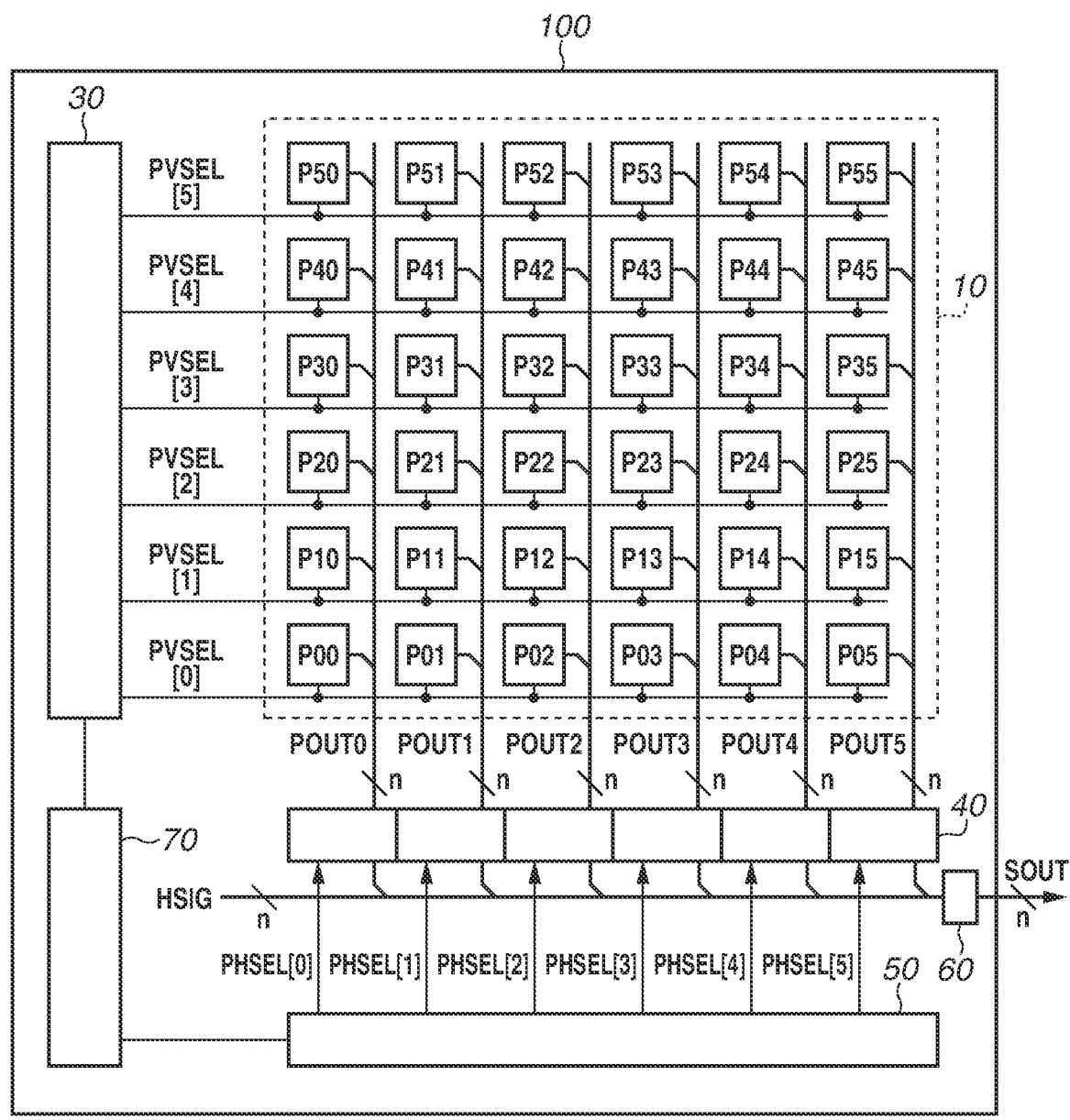
FIG. 1 is a block diagram schematically illustrating a configuration of a photoelectric conversion apparatus.

FIG. 1 is a block diagram schematically illustrating a configuration of the photoelectric conversion apparatus according to the present exemplary embodiment.

A photoelectric conversion apparatus 100 according to the present exemplary embodiment includes a pixel region 10, a vertical selection circuit 30, a signal processing circuit 40, a horizontal selection circuit 50, an output circuit 60, and a control circuit 70, as illustrated in FIG. 1.

The pixel region 10 includes a plurality of pixels P arranged in a matrix in a plurality of rows and columns. FIG. 1 illustrates thirty six pixels P arranged in six rows from a zeroth row to a fifth row and six columns from a zeroth column to a fifth column, together with reference numerals indicating row numbers and column numbers. For example, the pixel P disposed in the first row and the fourth column is indicated by a reference numeral P14.

Each of the number of rows and the number of columns in a pixel array in the pixel region 10 is not limited to a specific number. Further, the pixels P are not necessarily arranged two-dimensionally. For example, the pixel region 10 may be constituted of one pixel P or of the pixels P one-dimensionally arranged in a row direction or a column direction in the pixel region 10.

In each of the rows of the pixel array in the pixel region 10, a control line PVSEL is disposed to extend in a first direction (lateral direction in FIG. 1). The control line PVSEL is connected to each of the pixels P arranged in the first direction, and forms a signal line common to these pixels P. The first direction in which the control line PVSEL extends may be referred to as the row direction or a horizontal direction. In FIG. 1, the control line PVSEL is illustrated together with a reference numeral indicating the row number. For example, the control line PVSEL in the first row is indicated by a reference numeral PVSEL[1].

The control line PVSEL in each of the rows is connected to the vertical selection circuit 30. The vertical selection circuit 30 is a circuit unit that supplies the pixel P with a control signal for driving a signal generating circuit (not illustrated) within the pixel P via the control line PVSEL.

In each of the columns of the pixel array in the pixel region 10, an output line POUT is disposed to extend in a second direction (longitudinal direction in FIG. 1) intersecting the first direction. The output line POUT is connected to each of the pixels P arranged in the second direction, and forms a signal line common in these pixels P. The second direction in which the output line POUT extends may be referred to as the column direction or a vertical direction. In FIG. 1, the output line POUT is illustrated together with a reference numeral indicating the column number. For example, the output line POUT in the fourth column is indicated by a reference numeral POUT4. The output line POUT includes n signal lines for outputting an n-bit digital signal.

The output line POUT is connected to the signal processing circuit 40. The signal processing circuit 40 is provided for each of the columns of the pixel array in the pixel region 10, and is connected to the output line POUT of the corresponding column. The signal processing circuit 40 has a function of holding a signal output from the pixel P via the output line POUT of the corresponding column. Since the signal output from the pixel P is the n-bit signal input to the signal processing circuit 40 via the n signal lines of the output line POUT, the signal processing circuit 40 has at least n holding units to hold a signal of each bit.

The horizontal selection circuit 50 is a circuit unit that supplies a control signal for reading out a signal from the signal processing circuit 40 to the signal processing circuit 40. The horizontal selection circuit 50 supplies the control signal to the signal processing circuit 40 of each of the columns via a control line PHSEL. The signal processing circuit 40 that has received the control signal from the horizontal selection circuit 50 outputs a signal held in the holding unit to the output circuit 60 via a horizontal output line HSIG. In FIG. 1, the control line PHSEL is illustrated together with a reference numeral indicating the column number. For example, the control line PHSEL in the fourth column is indicated by a reference numeral PHSEL[4]. The horizontal output line HSIG includes n signal lines for outputting an n-bit digital signal.

The output circuit 60 is a circuit unit for outputting a signal supplied via the horizontal output line HSIG to outside of the photoelectric conversion apparatus 100, as an output signal SOUT. The control circuit 70 is a circuit unit for supplying control signals for controlling operation and timing of the operation of the vertical selection circuit 30, the signal processing circuit 40, the horizontal selection circuit 50, and the output circuit 60. At least some of the control signals for controlling the operation and the timing thereof of the vertical selection circuit 30, the signal processing circuit 40, the horizontal selection circuit 50, and the output circuit 60 may be supplied from the outside of the photoelectric conversion apparatus 100.

Figure 2:
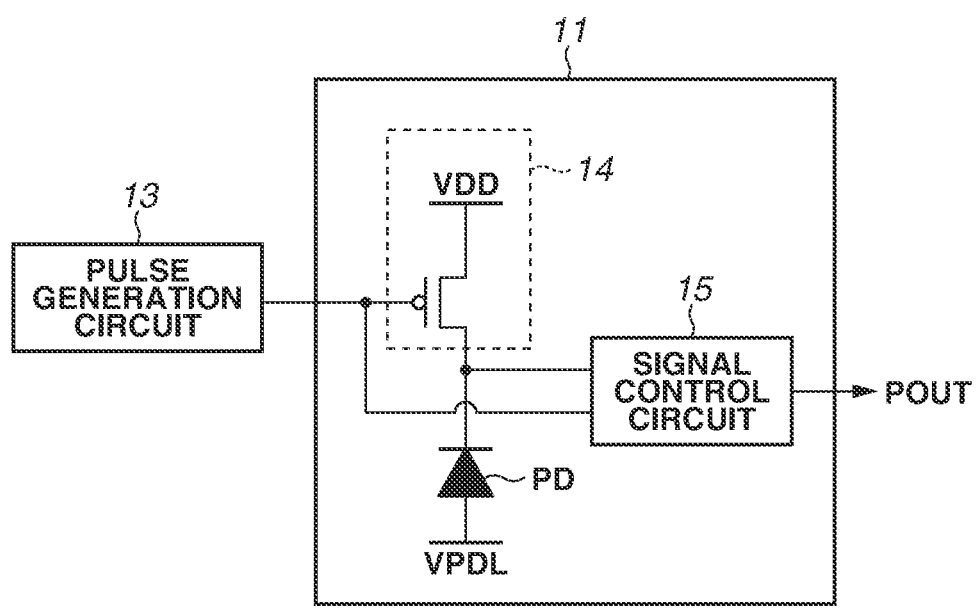
FIG. 2 is a diagram schematically illustrating a configuration of a pixel.

FIG. 2 is a diagram illustrating a configuration of a pixel 11 of the photoelectric conversion apparatus according to the present exemplary embodiment.

The pixel 11 includes a photodiode PD, and a photodiode control circuit 14 (first control circuit) and a signal control circuit 15 (second control circuit) that are connected to the photodiode PD. A voltage VPDL is applied to the photodiode PD. A pulse generation circuit 13 (generation circuit) provided outside the pixel 11 is connected to the photodiode control circuit 14 and the signal control circuit 15. The photodiode control circuit 14 has a P-channel metal oxide semiconductor (PMOS) transistor. A gate of the PMOS transistor is connected to the pulse generation circuit 13. One of a source and a drain of the PMOS transistor is supplied with a voltage (power supply voltage) VDD, and the other of the source and the drain of the PMOS transistor is connected to the photodiode PD and the signal control circuit 15. In the present exemplary embodiment, the voltage VDD is about 3.3 V, and the voltage VPDL is a negative voltage of about −20 V. The signal control circuit 15 outputs a signal to outside of the pixel 11 via the output line POUT. When the PMOS transistor is turned on, a reverse bias voltage based on the voltage VDD and the voltage VPDL is applied to the photodiode PD. Because the reverse bias voltage is larger than a breakdown voltage, the photodiode PD operates as a Geiger-mode avalanche photodiode.

Figure 3:
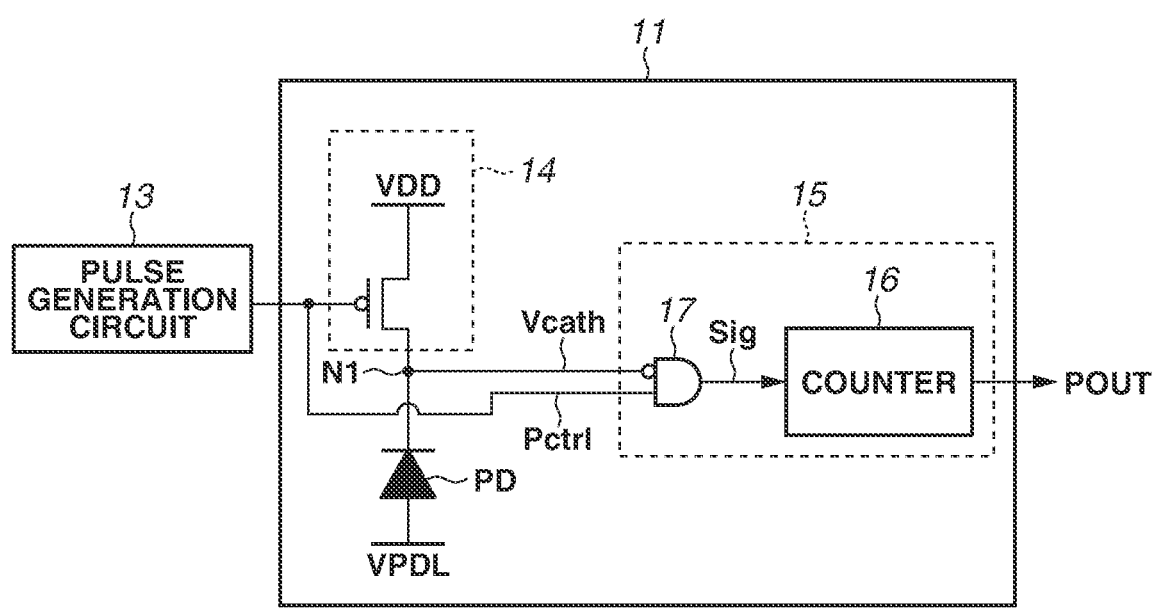
FIG. 3 is a diagram illustrating a configuration example of a pixel.

FIG. 3 is a diagram illustrating details of the signal control circuit 15 of the pixel 11 illustrated in FIG. 2. The signal control circuit 15 includes a counter 16 and an AND circuit 17 (logic circuit). To the AND circuit 17, an inverted signal of a signal Vcath of a node N1 (first node) is input. The node N1 is a node to which the photodiode PD and the photodiode control circuit 14 are connected. The signal Vcath is an output of the photodiode PD. The inverted signal of the signal Vcath input to the AND circuit 17 is a signal corresponding to the output of the photodiode PD. To the AND circuit 17, a signal Pctrl, which is a control signal from the pulse generation circuit 13, is input. The AND circuit 17 outputs, to the counter 16, a signal Sig that is a logical product of the inverted signal of the signal Vcath and the signal Pctrl. The signal Sig is a pulse waveform signal.

The counter 16 counts the number of times the signal Sig, which is output by the AND circuit 17, transitions from a low level to a high level. Accordingly, the counter 16 generates a count signal including a count value corresponding to incidence of a photon on the photodiode PD.

Figure 4:
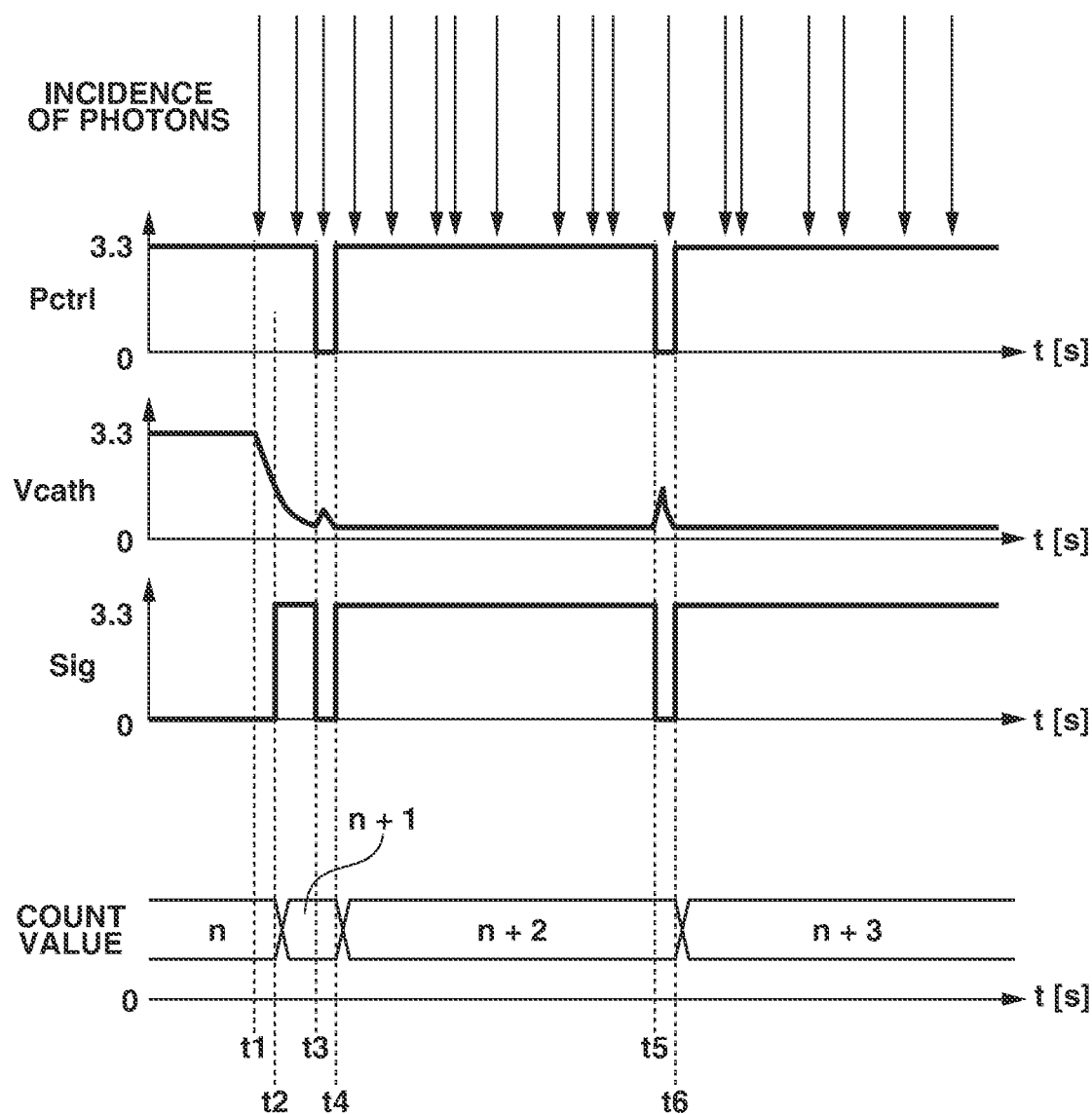
FIG. 4 is a timing chart illustrating operation of a pixel.

FIG. 4 is a timing chart illustrating operation of the pixel 11 illustrated in FIG. 3. FIG. 4 illustrates signals corresponding to the signals illustrated in FIG. 3. Timing at which a photon is incident on the photodiode PD is indicated by an arrow.

In a period before a time t1, the signal Pctrl is at the high level (3.3 V). Thus, the PMOS transistor of the photodiode control circuit 14 is off. Accordingly, the node N1, to which the photodiode control circuit 14 serving as the first control circuit and the photodiode PD are connected, is floating. In a period in which the signal Vcath is at the high level, recharging of the photodiode PD is completed. The period in which the signal Vcath is at the high level is a period in which the photodiode control circuit 14 controls the photodiode PD to be in the standby state in which avalanche multiplication is possible.

At the time t1, a photon is incident on the photodiode PD. This causes the avalanche multiplication in the photodiode PD, and the signal Vcath transitions from the high level (3.3 V) to the low level (0 V).

At a time t2, the inverted signal of the signal Vcath exceeds a logic threshold of the AND circuit 17. Accordingly, the signal Sig transitions from the low level (0 V) to the high level (3.3 V). The transition of the signal Sig from the low level to the high level increments the count value of the count signal of the counter 16 by one least significant bit (LSB).

At a time t3, the pulse generation circuit 13 changes the signal Pctrl to the low level. Accordingly, the PMOS transistor of the photodiode control circuit 14 is turned on, and recharging operation for returning the signal Vcath to the voltage VDD is performed. This period is a period in which the photodiode control circuit 14 is in a recharging state for returning the photodiode PD to the state where the avalanche multiplication is possible. However, FIG. 4 illustrates a case where a photon is incident on the photodiode PD in a period in which the recharging operation is performed. As a result of reoccurrence of the avalanche multiplication during the recharging operation, the signal Vcath does not return to the voltage VDD, and remains at a value near 0 V.

Simultaneously with the transition of the signal Pctrl to the low level, the signal Sig output by the AND circuit 17 transitions from the high level to the low level. In other words, an electric potential of an input portion of the signal control circuit 15 (second control circuit) is reset to an initial state.

At a time t4, the pulse generation circuit 13 changes the signal Pctrl to the high level. Accordingly, the PMOS transistor of the photodiode control circuit 14 is turned off, and the recharging operation of the signal Vcath ends. In the operation illustrated in FIG. 4, as described above, returning of the signal Vcath to the voltage VDD by the recharging operation is not performed, and the signal Vcath remains at the value near 0 V.

In addition, since the signal Pctrl transitions to the high level at the time t4, the signal Sig also transitions from the low level to the high level. Thus, the transition of the signal Sig from the low level to the high level increments the count value of the count signal of the counter 16 by one LSB.

Figure 5:
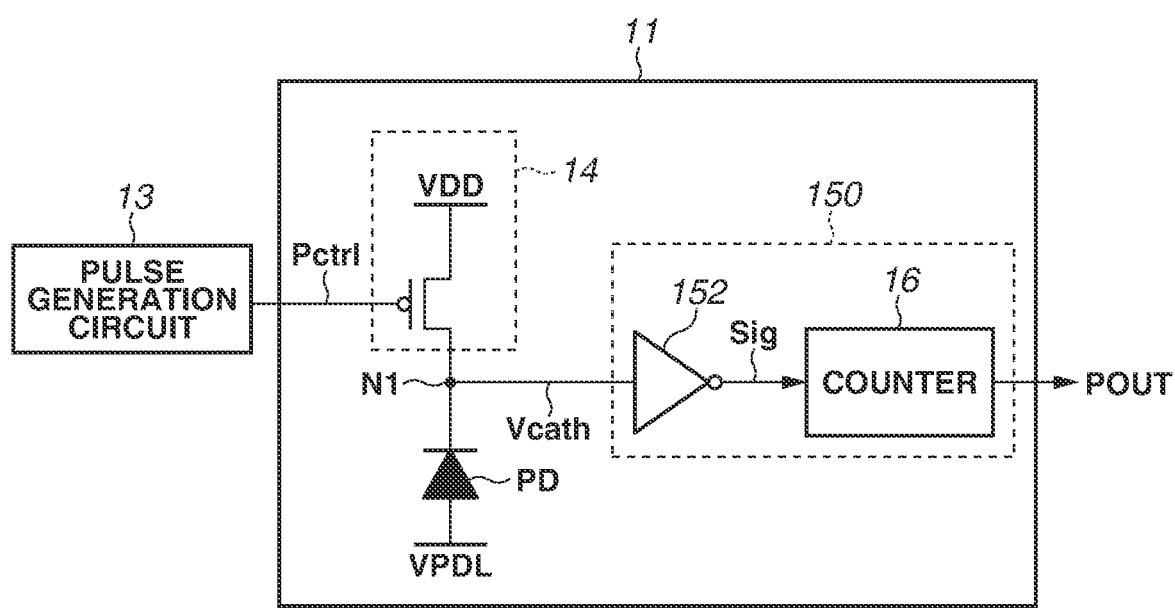
FIG. 5 is a diagram illustrating a configuration example of a pixel according to a comparative example.

In the present exemplary embodiment, the AND circuit 17 is provided. The AND circuit 17 takes the logical product of the signal Pctrl output by the pulse generation circuit 13 and the inverted signal of the signal Vcath. Herein, a case where the AND circuit 17 is not provided (i.e., comparative example) will be described. FIG. 5 illustrates the comparative example having a configuration in which the AND circuit 17 is not provided and the signal Vcath is input to an inverter 152. The inverter 152 outputs, to the counter 16, the signal Sig having an electric potential that changes to the high level when the voltage of the signal Vcath falls below a threshold. In other words, the inverter 152 forms a waveform based on the signal Vcath and outputs the inverted signal Sig to the counter 16.

Figure 6:
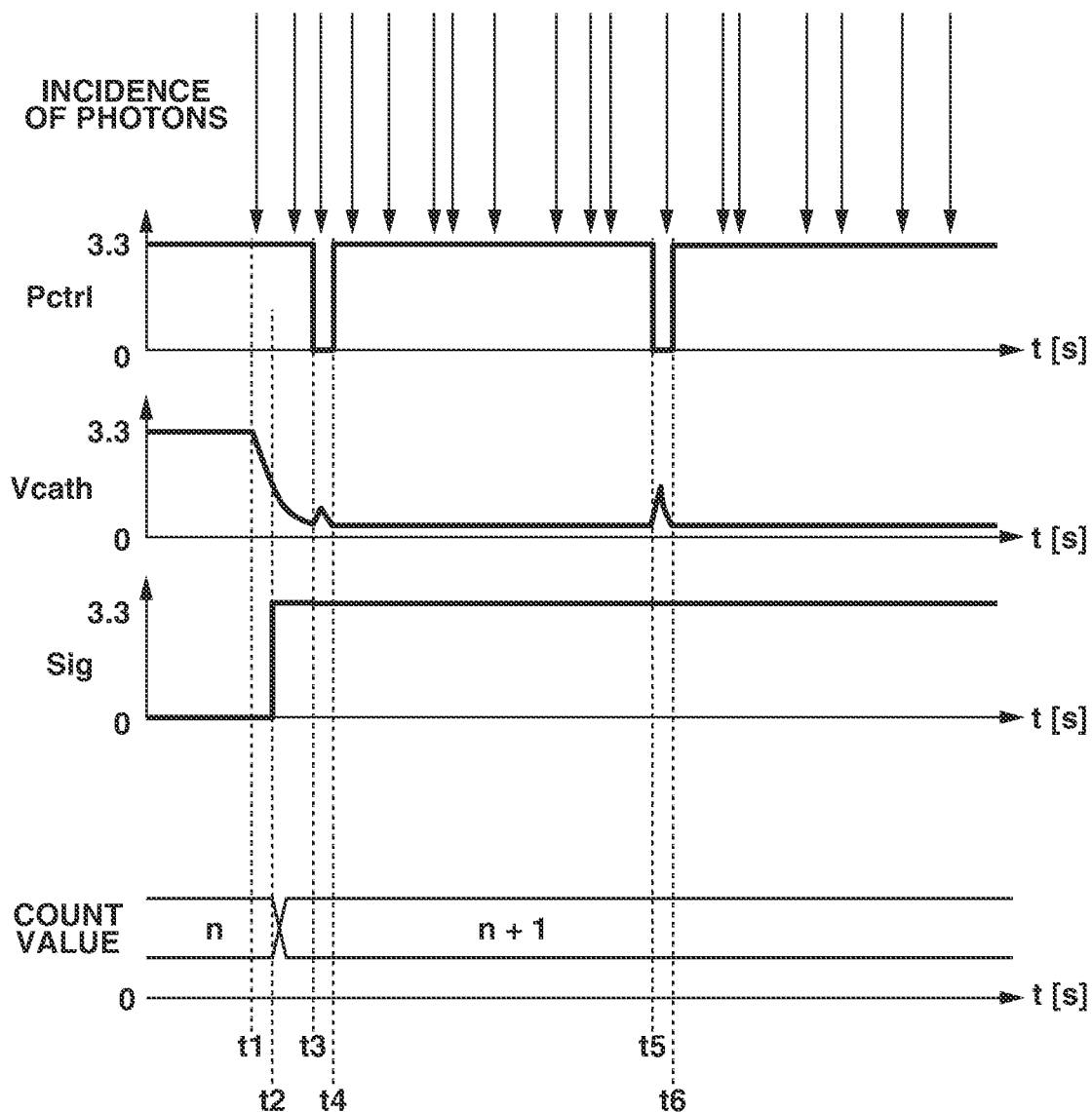
FIG. 6 is a timing chart illustrating operation of the pixel according to the comparative example.

FIG. 6 is a diagram illustrating operation of the comparative example in FIG. 5. FIG. 6 illustrates signals corresponding to the signals illustrated in FIG. 5. The timing of incidence of a photon and the timing of a change in the signal Pctrl are similar to those in FIG. 4.

At the time t2, the signal Sig changes to the high level. Subsequently, at the time t3, the signal Pctrl changes to the low level. However, avalanche multiplication occurs due to an incident photon in a period from the time t3 to the time t4. Thus, the signal Vcath does not return to a voltage VDD by the recharging operation and remains at the value near 0 V.

As a result, in the circuit of the comparative example, even if the signal Pctrl changes to the low level at the time t3, the signal Sig remains at the high level at the time t3 and thereafter.

As a result, neither a standby period for the avalanche multiplication from the time t4 to the time t5 nor a standby period for the avalanche multiplication at the time t6 and thereafter is counted as a period in which the avalanche multiplication has occurred. Thus, the count value remains at n+1.

On the other hand, the pixel 11 of the present exemplary embodiment includes the signal control circuit 15 to which the signal Pctrl of the pulse generation circuit 13 is input. Accordingly, it is possible to appropriately detect whether the avalanche multiplication has occurred in a period in which the photodiode PD is in the standby state for the avalanche multiplication. Thus, even in a case where light of high luminance is incident, it is possible to appropriately detect whether the avalanche multiplication has occurred in the period in which the photodiode PD is in the standby state for the avalanche multiplication.

In the present exemplary embodiment, as illustrated in FIG. 1, the configuration in which the entire configuration of the pixel 11 is provided on one semiconductor substrate has been described as an example. However, the configuration is not limited to this example. It is also possible to provide the photodiode PD on a first semiconductor substrate and the signal control circuit 15 on another semiconductor substrate, i.e., a second semiconductor substrate. Then, the first semiconductor substrate and the second semiconductor substrate can be stacked to constitute a stacked sensor. Further, the pulse generation circuit 13 and the photodiode control circuit 14 can be provided on either the first semiconductor substrate or the second semiconductor substrate.

In another example, the photodiode PD is provided on the first semiconductor substrate, and the pulse generation circuit 13, the photodiode control circuit 14, and the signal control circuit 15 are provided on the second semiconductor substrate. In this case, the photodiode PD of the first semiconductor substrate and the photodiode control circuit 14 of the second semiconductor substrate are connected via the node N1 serving as the first node. Further, the photodiode PD of the first semiconductor substrate and the signal control circuit 15 of the second semiconductor substrate are connected via a second node.

Figure 7:
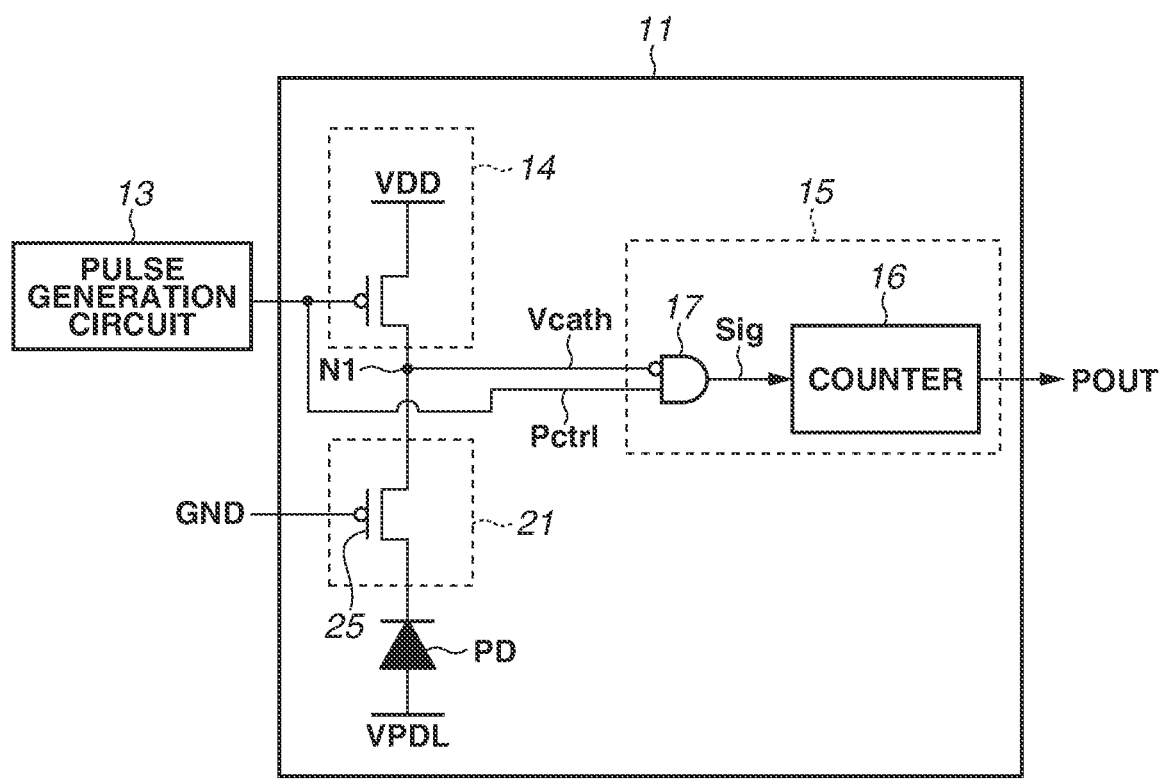
FIG. 7 is a diagram illustrating a configuration example of a pixel.

The present exemplary embodiment is not limited to the configuration illustrated in FIG. 3. For example, as illustrated in FIG. 7, a level shift circuit 21 may be provided between the photodiode PD and the node N1. The level shift circuit 21 has a PMOS transistor 25 having a gate to which a ground voltage is input. The PMOS transistor 25 is brought into an ON state by the ground voltage being input to the gate. An output portion of the level shift circuit 21 is connected to the photodiode control circuit 14 and the signal control circuit 15.

As a result of providing the level shift circuit 21, even in a case where the reverse bias voltage of the photodiode PD is the same voltage as that of the configuration in FIG. 3, the amplitude of the signal Vcath can be made smaller than that of the configuration in FIG. 3. This makes it possible to secure a withstand voltage margin of an input portion of the AND circuit 17. Further, there is a case where an excessive voltage larger than the breakdown voltage is applied to the avalanche photodiode. As for this excessive voltage, it is necessary to apply a bias higher than or equal to a voltage that enables all the photodiodes PD to operate in the Geiger mode, in consideration of variations in the breakdown voltage for each of the pixels 11. In addition, because the excessive voltage is equivalent to the amplitude of the signal Vcath in the avalanche multiplication and the subsequent recharging operation, it is necessary for the excessive voltage to be a voltage of amplitude larger than a logical threshold, as an input voltage of the signal control circuit 15. As a result of providing the level shift circuit 21, even if the power supply voltage VDD is smaller than that of the configuration in FIG. 3, a sufficient excessive voltage can be applied to the photodiode PD. In the configuration in FIG. 7, the power supply voltage VDD can be the same voltage as a power supply voltage of the AND circuit 17. In this case, a common power supply voltage generation circuit can generate the power supply voltage VDD and the power supply voltage of the AND circuit 17. Thus, a circuit area of the power supply voltage generation circuit can be reduced. In the configuration in FIG. 3, there is a case where the power supply voltage VDD and the power supply voltage of the AND circuit 17 are different.

In the present exemplary embodiment, the timing when the photodiode control circuit 14 transitions from the standby state to the recharging state coincides with the timing when the electric potential of the input portion of the counter 16 is reset to the initial state. However, the present exemplary embodiment is not limited to this example. For example, the electric potential of the input portion of the counter 16 can be reset to the initial state with a predetermined length of delay (such as a few periods of clock pulse) from the timing when the photodiode control circuit 14 transitions from the standby state to the recharging state.

A photoelectric conversion apparatus according to a second exemplary embodiment will be described. The description will focus on a point different from the first exemplary embodiment.

The photoelectric conversion apparatus according to the present exemplary embodiment is different from that according to the first exemplary embodiment in terms of a configuration of a signal control circuit 15 of a pixel 11.

Figure 8:
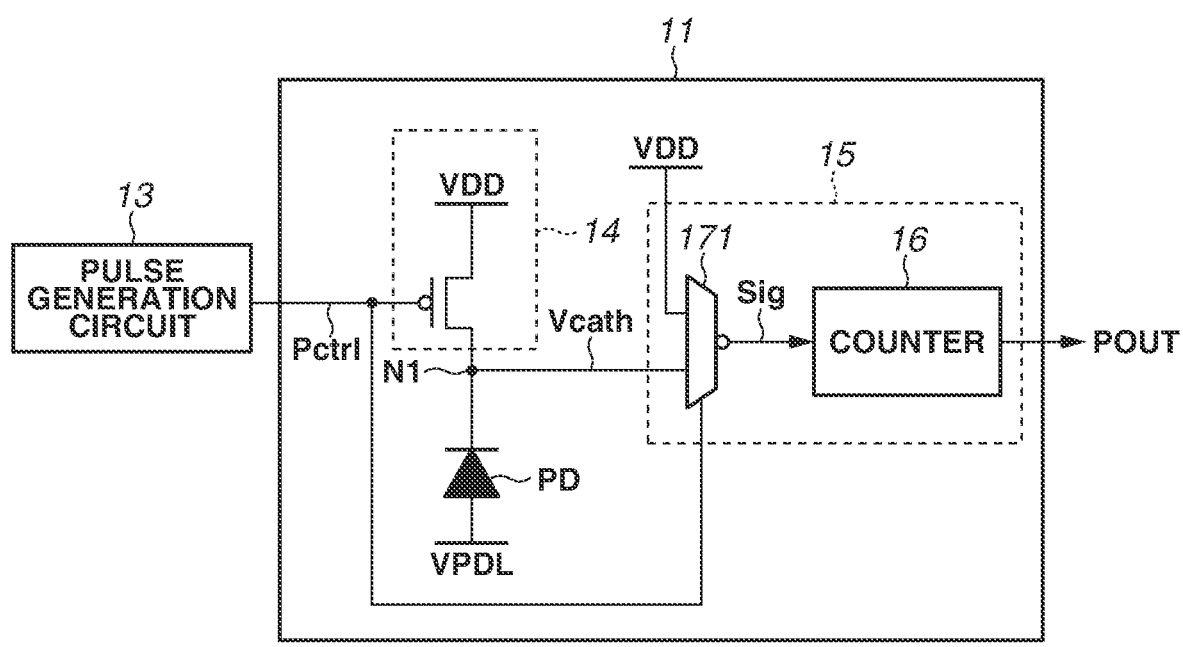
FIG. 8 is a diagram illustrating a configuration example of a pixel.

FIG. 8 is a diagram illustrating a configuration of the pixel 11 of the present exemplary embodiment.

The signal control circuit 15 of the pixel 11 of the present exemplary embodiment has a selection circuit 171. To the selection circuit 171, a signal Vcath and a power supply voltage VDD are input. The selection circuit 171 is connected to a pulse generation circuit 13, and a signal Pctrl serving as a control signal is input to the selection circuit 171.

The selection circuit 171 is a logic circuit that selects one of the signal Vcath and the power supply voltage VDD based on a signal level of the signal Pctrl. The selection circuit 171 outputs, to a counter 16, an inverted signal of the selected one as a signal Sig.

The selection circuit 171 selects the signal Vcath in a case where the signal Pctrl is at a high level (i.e., in a standby state for avalanche multiplication). The selection circuit 171 outputs an inverted signal of the signal Vcath to the counter 16.

On the other hand, the selection circuit 171 selects the power supply voltage VDD in a case where the signal Pctrl is at a low level (i.e., in a recharging state). The selection circuit 171 outputs an inverted signal of the power supply voltage VDD (i.e., signal at a ground voltage level) to the counter 16.

The selection circuit 171 typically includes a waveform shaping circuit. In other words, in a case where the signal Pctrl is at the low level, the waveform shaping circuit of the selection circuit 171 maintains the signal Sig at the low level until the signal Vcath falls below a predetermined voltage. When the signal Vcath falls below the predetermined voltage, the waveform shaping circuit of the selection circuit 171 changes the signal Sig to the high level.

Operation of the pixel 11 according to the present exemplary embodiment can be similar to that in FIG. 4. Thus, an effect similar to that of the photoelectric conversion apparatus according to the first exemplary embodiment can be obtained in the present exemplary embodiment.

The level shift circuit 21 illustrated in FIG. 7 can also be provided in the present exemplary embodiment.

A photoelectric conversion apparatus according to a third exemplary embodiment will be described. The description will focus on a point different from the first exemplary embodiment.

A pixel 11 of the photoelectric conversion apparatus according to the present exemplary embodiment is different from that according to the first exemplary embodiment in terms of a configuration of each of a photodiode control circuit 14 and a signal control circuit 15. Further, a pulse generation circuit 13 outputs signals Pctrl_1 and Pctrl_2 serving as a plurality of control signals.

Figure 9:
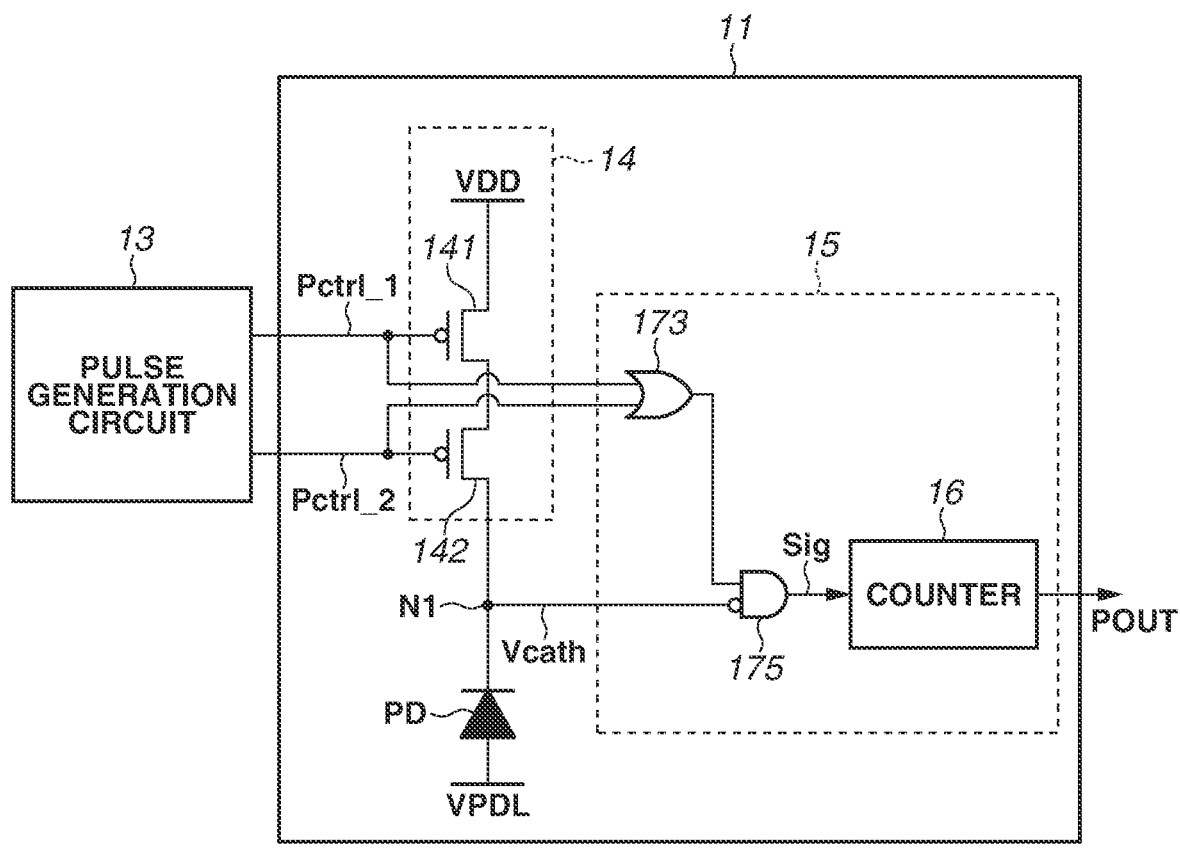
FIG. 9 is a diagram illustrating a configuration example of a pixel.

FIG. 9 is a diagram illustrating a configuration of the pixel 11 according to the present exemplary embodiment. The photodiode control circuit 14 includes a PMOS transistor 141 and a PMOS transistor 142.

The pulse generation circuit 13 outputs the signal Pctrl_1 to a gate of the PMOS transistor 141. The pulse generation circuit 13 also outputs the signal Pctrl_2 to a gate of the PMOS transistor 142.

The signal control circuit 15 includes an OR circuit 173 and an AND circuit 175. An input portion of the OR circuit 173 is connected to the pulse generation circuit 13, and the signal Pctrl_1 and the signal Pctrl_2 are input to the OR circuit 173. The OR circuit 173 outputs a logical sum of the signals Pctrl_1 and Pctrl_2 to the AND circuit 175.

An input portion of the AND circuit 175 is connected to a node N1 and the OR circuit 173, and an inverted signal of a signal Vcath and an output of the OR circuit 173 are input to the AND circuit 175. The AND circuit 175 outputs, to a counter 16, a logical product of the inverted signal of the signal Vcath and the output of the OR circuit 173 as a signal Sig.

Figure 10:
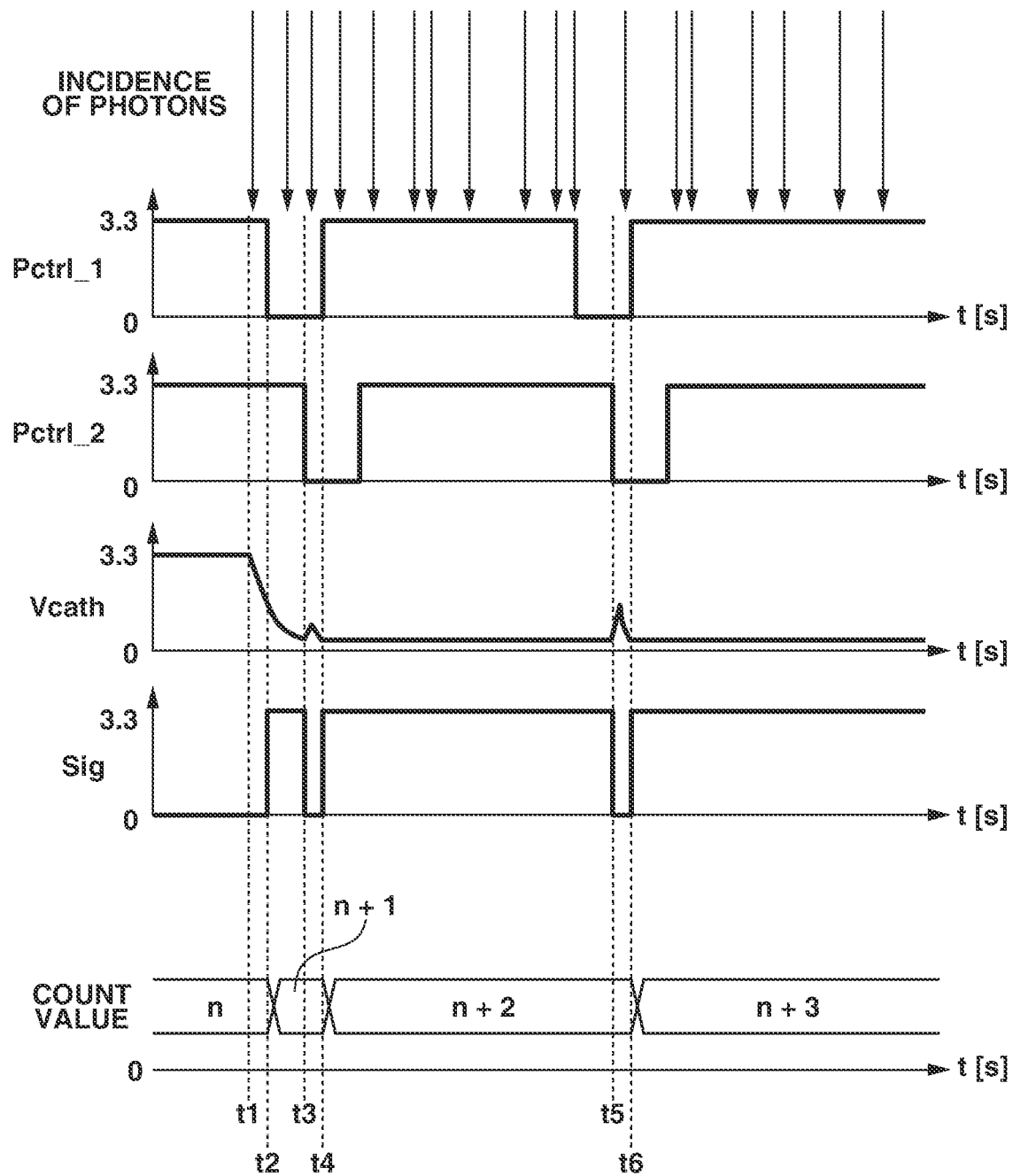
FIG. 10 is a timing chart illustrating operation of a pixel.

FIG. 10 is a diagram illustrating operation of the pixel 11 illustrated in FIG. 9. FIG. 10 illustrates signals corresponding to the signals illustrated in FIG. 9.

The signals Pctrl_1 and Pctrl_2 have the same period. However, the signals Pctrl_1 and Pctrl_2 have different phases.

Recharging is enabled only in a period in which the signal Pctrl_1 and the signal Pctrl_2 are at the low level. Thus, even if the period in which the signal Pctrl_1 and the signal Pctrl_2 are at the low level is long compared with the signal Pctrl in FIG. 6, a similar recharging period can be provided by using a phase difference. As a result, compared with the case where driving is performed by the single signal Pctrl as illustrated in FIG. 6, for example, fluctuations of the recharging period due to an influence of waveform rounding in a signal transmission path can be reduced. In the present exemplary embodiment, a standby state for avalanche multiplication and a recharging state can be controlled by the signals Pctrl_1 and Pctrl_2 serving as the plurality of control signals. As a result of an input of the signals Pctrl_1 and Pctrl_2 serving as the plurality of control signals to the signal control circuit 15, the signal Sig transitions from the high level to the low level in the recharging state. Accordingly, whether the avalanche multiplication has occurred can be detected appropriately in a period of the standby state for the next avalanche multiplication.

In this way, an effect similar to that of the first exemplary embodiment can be obtained in the photoelectric conversion apparatus of the present exemplary embodiment.

The idea of the present exemplary embodiment can be combined with the ideas of other exemplary embodiments. For example, in the pixel 11 in FIG. 8 according to the second exemplary embodiment, the configuration of the photodiode control circuit 14 can be the configuration thereof according to the present exemplary embodiment. In this case, in place of the signal Pctrl in FIG. 8, the signals Pctrl_1 and Pctrl_2 serving as the plurality of control signals according to the present exemplary embodiment can be input to the selection circuit 171. Then, the selection circuit 171 can select either the power supply voltage VDD or the signal Vcath based on the signals Pctrl_1 and Pctrl_2.

A photoelectric conversion apparatus according to a fourth exemplary embodiment will be described. The description will focus on a point different from the first exemplary embodiment.

A pixel 11 of the photoelectric conversion apparatus according to the present exemplary embodiment is different from that according to the first exemplary embodiment in terms of a configuration of a photodiode control circuit 14.

Figure 11:
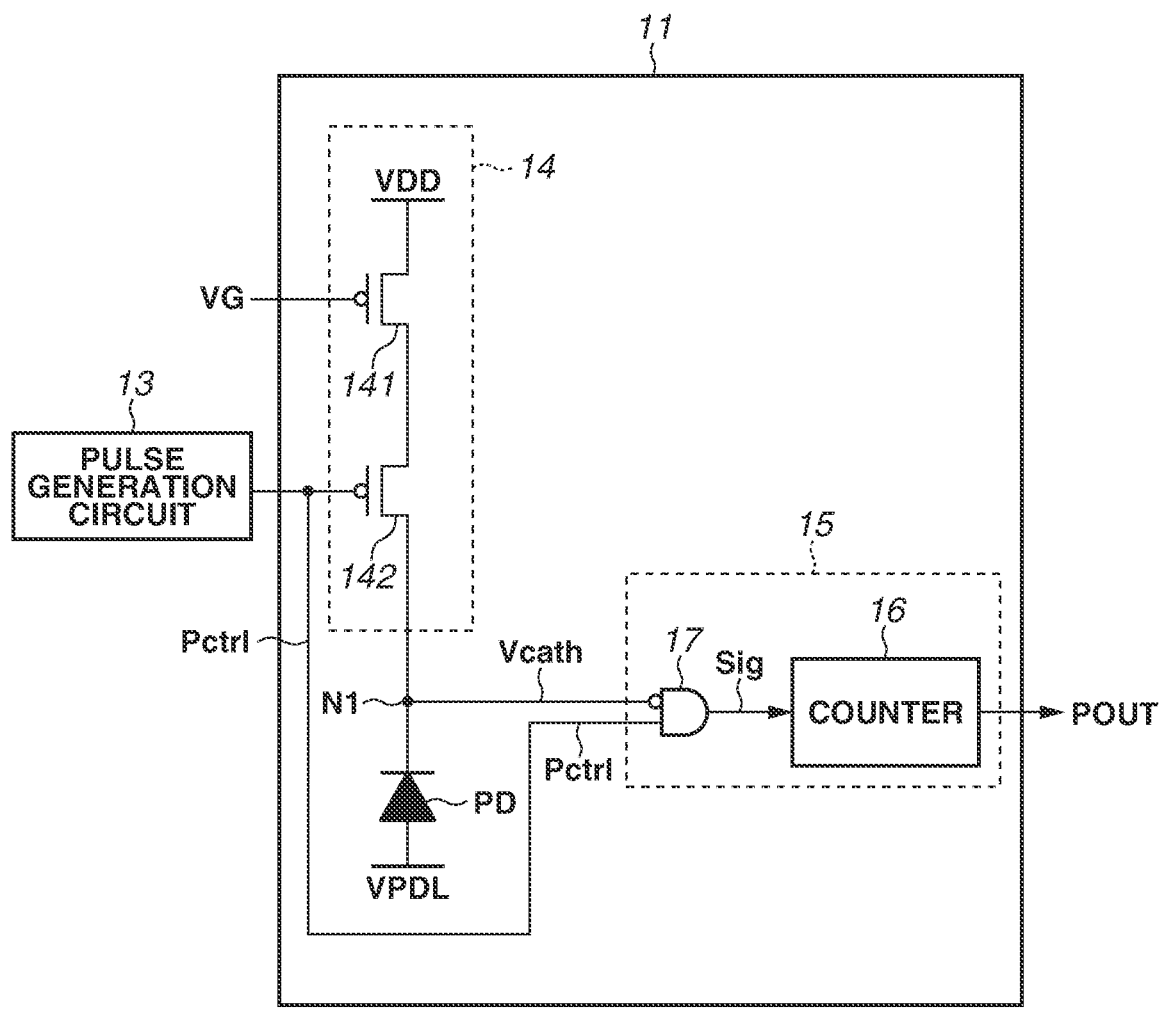
FIG. 11 is a diagram illustrating a configuration example of a pixel.

FIG. 11 is a diagram illustrating a configuration of the pixel 11 according to the present exemplary embodiment. The photodiode control circuit 14 includes a PMOS transistor 141 and a PMOS transistor 142. The PMOS transistor 141 has a gate to which a constant voltage VG is applied, and serves as a resistance. In this configuration, a gate area of the PMOS transistor 142 can be small compared with a configuration using a single PMOS transistor as in the configuration in FIG. 5. Thus, a gate capacitance of a connection destination of a signal Pctrl can be small. As a result, an influence of waveform rounding of the signal Pctrl can be reduced. Further, in the present exemplary embodiment, if a parasitic capacitance of the PMOS transistor 142 with respect to a node N1 is smaller than a parasitic capacitance with respect to the node N1 of the PMOS transistor in FIG. 5, a consumption amount of electric charges at the time of avalanche amplification decreases. Thus, the present exemplary embodiment is more desirable.

Figure 12:
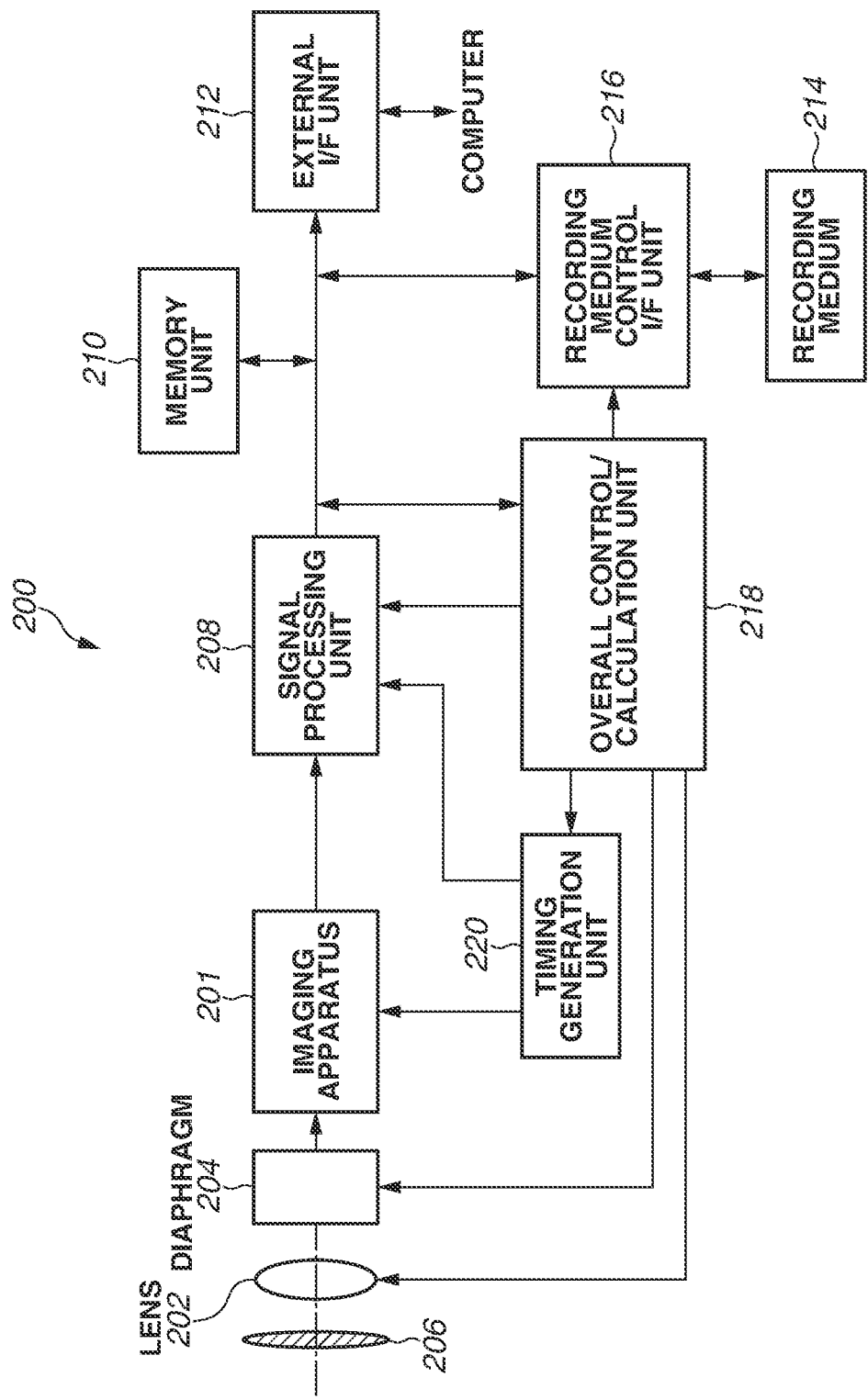
FIG. 12 is a block diagram schematically illustrating a configuration of an imaging system.

An imaging system according to a fifth exemplary embodiment of the present disclosure will be described with reference to FIG. 12. FIG. 12 is a block diagram schematically illustrating a configuration of the imaging system according to the present exemplary embodiment.

The photoelectric conversion apparatus 100 described above in each of the first to fourth exemplary embodiments is applicable to various kinds of imaging system. Examples of the imaging system to which the photoelectric conversion apparatus 100 is applicable include a digital still camera, a digital camcorder, a monitoring camera, a copier, a facsimile, a mobile phone, an on-vehicle camera, and an observation satellite. Further, a camera module including an optical system such as a lens and an imaging apparatus is also included in the imaging system. FIG. 12 is a block diagram illustrating a digital still camera serving as one of the examples.

An imaging system 200 illustrated in FIG. 12 includes an imaging apparatus 201, a lens 202 that forms an optical image of an object on the imaging apparatus 201, a diaphragm 204 for varying an amount of light passing through the lens 202, and a barrier 206 for protecting the lens 202. The lens 202 and the diaphragm 204 constitute an optical system that condenses light on the imaging apparatus 201. The imaging apparatus 201 is the photoelectric conversion apparatus 100 described in any one of the first to fourth exemplary embodiments, and converts the optical image formed by the lens 202 into image data.

The imaging system 200 includes a signal processing unit 208 that processes an output signal output from the imaging apparatus 201. The signal processing unit 208 performs analog-to-digital (AD) conversion of an analog signal output by the imaging apparatus 201 into a digital signal. In addition, the signal processing unit 208 operates to perform various kinds of processing such as correction and compression as necessary, and outputs image data after the processing. An AD converter, which is a part of the signal processing unit 208, may be formed on a semiconductor substrate on which the imaging apparatus 201 is formed or may be formed on a semiconductor substrate different from that of the imaging apparatus 201. The imaging apparatus 201 and the signal processing unit 208 may be formed on the same semiconductor substrate.

The imaging system 200 further includes a memory unit 210 for temporarily storing image data, and an external interface (I/F) unit 212 for communication with an external computer. The imaging system 200 further includes a recording medium 214 such as a semiconductor memory for recording or reading out imaging data, and a recording medium control I/F unit 216 for controlling the recording or reading out with respect to the recording medium 214. The recording medium 214 may be built in the imaging system 200 or detachable from the imaging system 200.

The imaging system 200 further includes an overall control/calculation unit 218 that performs various calculations and controls the entire digital still camera, and a timing generation unit 220 that outputs various timing signals to the imaging apparatus 201 and the signal processing unit 208. Here, the timing signals can be input from outside. The imaging system 200 can include at least the imaging apparatus 201 and the signal processing unit 208 that processes the output signal output from the imaging apparatus 201.

The imaging apparatus 201 outputs an imaging signal to the signal processing unit 208. The signal processing unit 208 performs predetermined signal processing on the imaging signal output from the imaging apparatus 201, and outputs image data based on a result of the processing. The signal processing unit 208 generates an image using the imaging signal.

In this way, according to the present exemplary embodiment, it is possible to implement the imaging system to which the photoelectric conversion apparatus 100 according to any one of the first to fourth exemplary embodiments is applied.

Figure 13A:
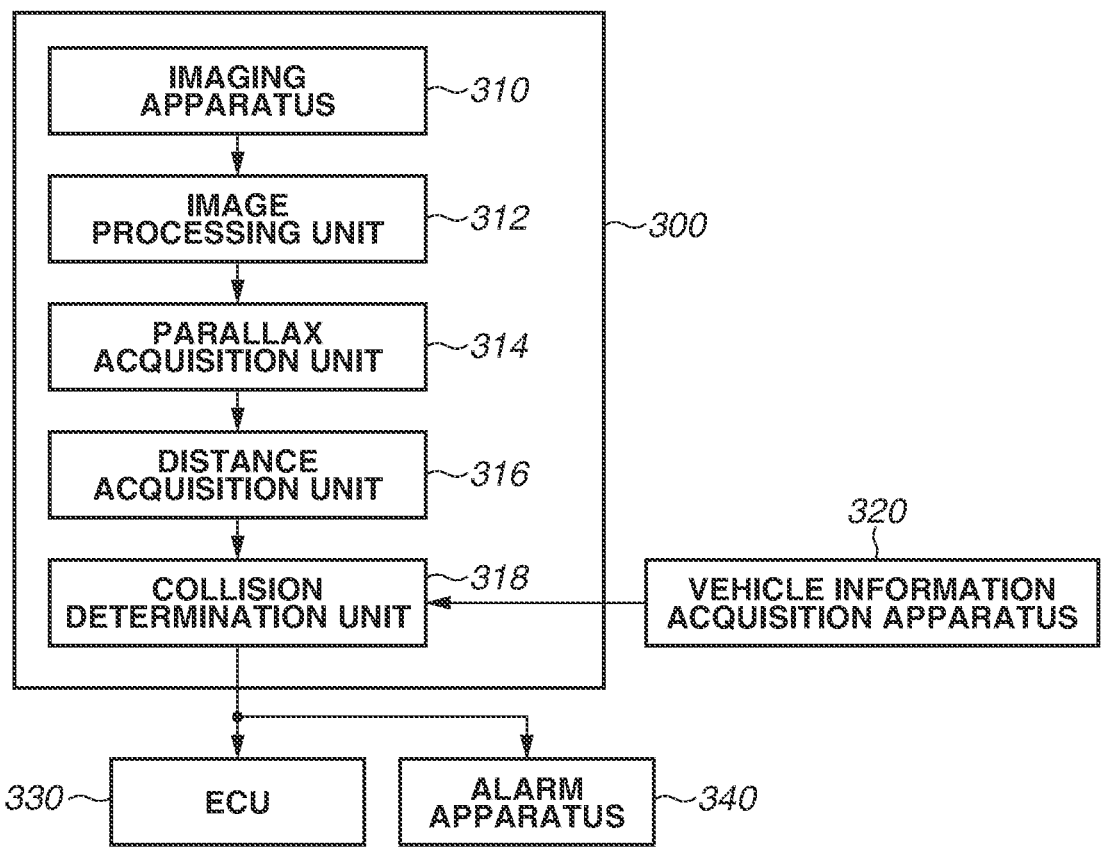
FIGS. 13A and 13B are diagrams illustrating a configuration example of an imaging system and a configuration example of a movable object, respectively.
Figure 13B:
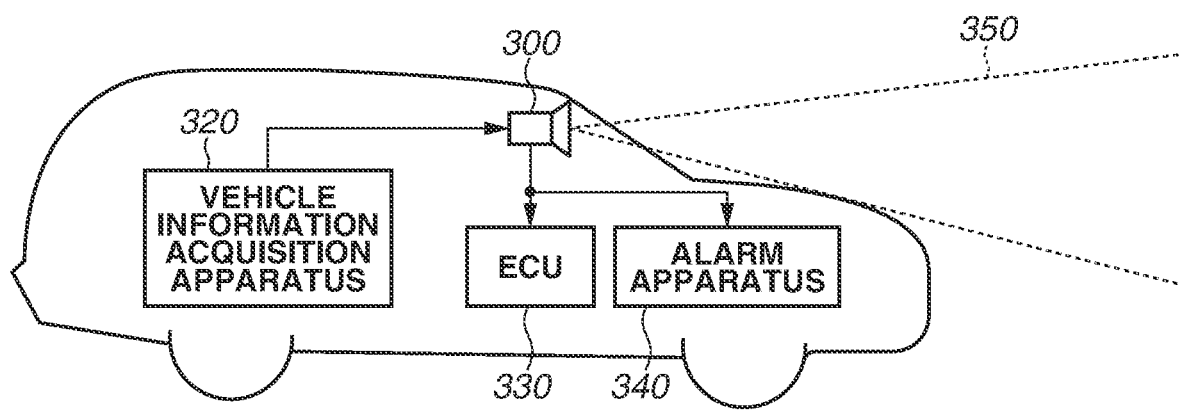

An imaging system and a movable object according to a sixth exemplary embodiment of the present disclosure will be described with reference to FIGS. 13A and 13B. FIGS. 13A and 13B are diagrams illustrating a configuration of the imaging system and a configuration of the movable object according to the present exemplary embodiment, respectively.

FIG. 13A is a block diagram illustrating an example of an imaging system for an on-vehicle camera. An imaging system 300 includes an imaging apparatus 310. The imaging apparatus 310 is the photoelectric conversion apparatus 100 described in any one of the first to fourth exemplary embodiments. The imaging system 300 also includes an image processing unit 312 and a parallax acquisition unit 314. The image processing unit 312 performs image processing on a plurality of pieces of image data acquired by the imaging apparatus 310. The parallax acquisition unit 314 calculates a parallax (phase difference of a parallax image) from a plurality of pieces of image data acquired by the imaging system 300. The imaging system 300 further includes a distance acquisition unit 316 and a collision determination unit 318. The distance acquisition unit 316 calculates a distance to a target object based on the calculated parallax. The collision determination unit 318 determines whether there is a possibility of collision based on the calculated distance. Here, the parallax acquisition unit 314 and the distance acquisition unit 316 are each an example of a distance information acquisition unit that acquires distance information indicating a distance to the target object. More specifically, the distance information is information about a parallax, a defocusing amount, and a distance to the target object. The collision determination unit 318 can determine a possibility of collision using any of these pieces of distance information. The distance information acquisition unit may be implemented by an exclusively designed hardware component or may be implemented by a software module. Further, the distance information acquisition unit may be implemented by a field programmable gate array (FPGA) or an application specific integrated circuit (ASIC), or may be implemented by a combination thereof.

The imaging system 300 is connected with a vehicle information acquisition apparatus 320, and can acquire vehicle information such as a vehicle speed, a yaw rate, and a steering angle. The imaging system 300 is also connected with an electronic control unit (ECU) 330. The ECU 330 is a control apparatus that outputs a control signal for generating a braking force with respect to a vehicle based on a determination result obtained by the collision determination unit 318. The imaging system 300 is also connected with an alarm apparatus 340 that alerts a driver based on the determination result obtained by the collision determination unit 318. For example, in a case where there is a high possibility of collision as the result of the determination by the collision determination unit 318, the ECU 330 performs a vehicle control for avoiding collision and reducing damage by, for example, braking, returning an accelerator, and reducing an engine output. The alarm apparatus 340 alerts a user by, for example, sounding an alarm, displaying warning information on a screen of a system such as a car navigation system, and applying vibration to a seat belt and a steering wheel.

In the present exemplary embodiment, an area around a vehicle such as a frontward area or a rearward area is imaged by the imaging system 300. FIG. 13B illustrates an imaging system in a case where the frontward area (image sensing area 350) of the vehicle is imaged. The vehicle information acquisition apparatus 320 transmits an instruction to the imaging system 300 or the imaging apparatus 310. Such a configuration can improve accuracy of distance measurement.

The example of the control for not colliding with another vehicle has been described above. However, the present exemplary embodiment is also applicable to, for example, a control for automatic driving by following another vehicle, and a control for automatic driving not to deviate from a traffic lane. Further, the imaging system is applicable not only to the vehicle such as an automobile but also to, for example, a movable object (movable apparatus) such as a ship, an aircraft, or an industrial robot. In addition, the imaging system is applicable not only to the movable object but also to an apparatus that utilizes object recognition in a wide area, such as an intelligent transport system (ITS).

The present disclosure is not limited to the above-described exemplary embodiments and can be modified in a variety of ways.

Exemplary embodiments of the present disclosure also include an example in which part of the configuration of any one of the exemplary embodiments is added to another one of the exemplary embodiments, and an example in which part of the configuration of any one of the exemplary embodiments is replaced with part of the configuration of another one of the exemplary embodiments.

The imaging system according to each of the above-described fifth and sixth exemplary embodiments is an example of the imaging system to which the photoelectric conversion apparatus of the present disclosure is applicable. However, the imaging system to which the photoelectric conversion apparatus of the present disclosure is applicable is not limited to the configurations illustrated in FIGS. 12, 13A, and 13B.

Any of the above-described exemplary embodiments is merely a specific example in implementing the present disclosure, and the technical scope of the present disclosure is not to be interpreted by these exemplary embodiments in a limited way. In other words, the present disclosure can be implemented in various forms without departing from the technical idea or the substantial characteristics thereof.

The technique of the present disclosure can provide the photoelectric conversion apparatus that appropriately detects the number of periods in which avalanche multiplication has occurred among a plurality of periods of the standby state for the avalanche multiplication.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

What is claimed is:

1. A photoelectric conversion apparatus comprising:
a photodiode configured to perform avalanche multiplication;
a transistor connected to the photodiode and having a gate receiving a control signal;
a logic circuit receiving a signal based on the control signal and a signal based on an output from the photodiode and outputting a signal according to a result of a logic operation on the signal based on the control signal and the signal based on the output from the photodiode; and
a counter connected to the logic circuit, wherein the counter is configured to count a number of pulses of the signal output from the logic circuit, and wherein the control signal is periodically input during a period from a reset of a count value of the counter to a next reset of the count value.

2. The photoelectric conversion apparatus according to claim 1, wherein the signal based on the output from the photodiode transitions from a first level to a second level according to incidence of a photon to the photodiode, and wherein when the signal based on the output from the photodiode is at the second level, a level of the signal according to the result of the logical operation transitions according to switching of the signal based on the control signal from a third level to a fourth level.

3. The photoelectric conversion apparatus according to claim 2, wherein the transistor is in an off state when the signal based on the control signal is at the third level, and wherein the transistor is in an on state when the signal based on the control signal is at the fourth level.

4. An imaging system comprising:
the photoelectric conversion apparatus according to claim 1; and
a signal processing unit configured to process a signal output from the photoelectric conversion apparatus.

5. A movable object comprising:
the photoelectric conversion apparatus according to claim 1;
a distance information acquisition unit configured to acquire distance information indicating a distance to a target object, based on a signal from the photoelectric conversion apparatus; and
a control unit configured to control the movable object based on the distance information.

6. The photoelectric conversion apparatus according to claim 1,
wherein the control signal is a clock signal.

7. A method for controlling a photoelectric conversion apparatus comprising a photodiode configured to perform avalanche multiplication, the method comprising:
inputting a control signal to a gate of a transistor connected to the photodiode; and
performing a logical operation on a signal based on an output from the photodiode and a signal based on the control signal and counting a number of pulses of a signal according to a result of the logic operation,
wherein the signal based on the output from the photodiode transitions from a first level to a second level according to incidence of a photon to the photodiode, and
wherein when the signal based on the output from the photodiode is at the second level, a level of the signal according to the result of the logical operation transitions according to switching of the signal based on the control signal from a third level to a fourth level.

8. The method for controlling a photoelectric conversion apparatus according to claim 7,
wherein the transistor is in an off state when the signal based on the control signal is at the third level, and
wherein the transistor is in an on state when the signal based on the control signal is at the fourth level.

9. A photoelectric conversion apparatus comprising:
a photodiode configured to perform avalanche multiplication;
a transistor connected to the photodiode and having a gate receiving a control signal;
a logic circuit receiving a signal based on the control signal and a signal based on an output from the photodiode and outputting a signal according to a result of a logic operation on the signal based on the control signal and the signal based on the output from the photodiode; and
a counter connected to the logic circuit,
wherein the counter is configured to count a number of pulses of the signal output from the logic circuit,
wherein the signal based on the output from the photodiode transitions from a first level to a second level according to incidence of a photon to the photodiode, and
wherein when the signal based on the output from the photodiode is at the second level, a level of the signal according to the result of the logical operation transitions according to switching of the signal based on the control signal from a third level to a fourth level.

10. The photoelectric conversion apparatus according to claim 9,
wherein the transistor is in an off state when the signal based on the control signal is at the third level, and
wherein the transistor is in an on state when the signal based on the control signal is at the fourth level.

11. An imaging system comprising:
the photoelectric conversion apparatus according to claim 9; and
a signal processing unit configured to process a signal output from the photoelectric conversion apparatus.

12. A movable object comprising:
the photoelectric conversion apparatus according to claim 9;
a distance information acquisition unit configured to acquire distance information indicating a distance to a target object, based on a signal from the photoelectric conversion apparatus; and
a control unit configured to control the movable object based on the distance information.

13. A photoelectric conversion apparatus comprising:
a photodiode configured to perform avalanche multiplication;
a transistor connected to the photodiode and having a gate receiving a control signal; and
a logic circuit receiving a signal based on the control signal and a signal based on an output from the photodiode and outputting a signal according to a result of a logic operation on the signal based on the control signal and the signal based on the output from the photodiode,
wherein the control signal is a pulse signal periodically inputted during a period in which the photodiode can perform avalanche multiplication, and
wherein the control signal is a clock signal.

14. The photoelectric conversion apparatus according to claim 13, further comprising:
a counter connected to the logic circuit,
wherein the counter is configured to count a number of pluses of athe signal output from the logic circuit.

15. An imaging system comprising:
the photoelectric conversion apparatus according to claim 13; and
a signal processing unit configured to process a signal output from the photoelectric conversion apparatus.

16. A movable object comprising:
the photoelectric conversion apparatus according to claim 13;
a distance information acquisition unit configured to acquire distance information indicating a distance to a target object, based on a signal from the photoelectric conversion apparatus; and
a control unit configured to control the movable object based on the distance information.

* * * * *